(12) United States Patent
Kliewer et al.

(10) Patent No.: US 7,877,649 B2
(45) Date of Patent: Jan. 25, 2011

(54) METHOD AND APPARATUS FOR TESTING A MEMORY CHIP USING A COMMON NODE FOR MULTIPLE INPUTS AND OUTPUTS

(75) Inventors: Joerg Kliewer, Munich (DE); Manfred Proell, Dorfen (DE); Stephan Schroeder, Munich (DE); Georg Eggers, Munich (DE); Wolfgang Ruf, Friedberg (DE); Hermann Hass, Hoehenkirchen-Siegertsbrunn (DE)

(73) Assignee: Qimonda AG, Munich (DE)

( * ) Notice: Subject to any disclaimer, the term of this patent is extended or adjusted under 35 U.S.C. 154(b) by 606 days.

(21) Appl. No.: 11/934,644

(22) Filed: Nov. 2, 2007

(65) Prior Publication Data

US 2008/0141075 A1      Jun. 12, 2008

(30) Foreign Application Priority Data

Nov. 2, 2006   (DE) ................ 10 2006 051 591

(51) Int. Cl.
*G11C 29/00* (2006.01)
(52) U.S. Cl. ............... 714/718; 714/42; 714/45
(58) Field of Classification Search .......... 365/230.06, 365/200, 201; 714/718, 719, 42, 45
See application file for complete search history.

(56) References Cited

U.S. PATENT DOCUMENTS

| 5,375,096 | A  | * | 12/1994 | Sugibayashi | ........... 365/230.06 |
| 6,092,227 | A  |   | 7/2000 | Toki et al. | |
| 6,269,033 | B1 | * | 7/2001 | Ishida et al. | ................ 365/200 |
| 6,335,887 | B1 |   | 1/2002 | Aoki et al. | |
| 6,618,305 | B2 | * | 9/2003 | Ernst et al. | .................. 365/201 |
| 6,715,117 | B2 |   | 3/2004 | Mangyo et al. | |
| 6,868,021 | B2 | * | 3/2005 | Tanabe et al. | ............... 365/200 |

FOREIGN PATENT DOCUMENTS

| DE | 19818045 | 3/1999 |
| DE | 10059667 | 12/2001 |
| DE | 10108044 | 4/2002 |

* cited by examiner

*Primary Examiner*—David Ton
(74) *Attorney, Agent, or Firm*—Patterson & Sheridan, LLP (57) ABSTRACT

An apparatus and methods for testing an integrated device comprising memory a test device are provided. At least two data inputs of the memory are coupled to a data output of the test device. As an alternative, at least two data outputs of the memory are coupled to a data input of the test device. Test data are transferred from the test device to the memory chip and written to memory cells of the memory. Data are read from the memory cells of the memory and transferring from the memory to the test device. The data read from the memory chip are compared with the test data written to the memory in order to identify faults of the memory.

5 Claims, 10 Drawing Sheets

METHOD AND APPARATUS FOR TESTING A MEMORY CHIP USING A COMMON NODE FOR MULTIPLE INPUTS AND OUTPUTS

CROSS-REFERENCE TO RELATED APPLICATIONS

This application claims foreign priority benefits under 35 U.S.C. §119 to co-pending German patent application number DE 10 2006 051 591.9-55, filed Nov. 2, 2006. This related patent application is herein incorporated by reference in its entirety.

BACKGROUND OF THE INVENTION

Rising cost pressure in the production of DRAMs and other components requires not only aggressive shrink road maps, but also a reduction of the test costs which can now already constitute up to 2% of the total production costs.

BRIEF DESCRIPTION OF THE DRAWINGS

The features of embodiments will become clear from the following description and the accompanying drawings. It is to be noted, however, that the accompanying drawings illustrate only typical embodiments and are, therefore, not to be considered limiting of the scope of the invention. It may admit other equally effective embodiments.

DETAILED DESCRIPTION OF THE PREFERRED EMBODIMENT

In following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

In some cases, embodiments of the invention may be used with multiple types of memory or with a memory which is included on a device with multiple other types of memory. Thus, an embodiment may include at least one volatile memory chip/device that performs internal refresh-cycles and one or more other types of memory chips/devices. An embodiment may also include memory and other circuitry in one integrated device. The memory types may include volatile memory and non-volatile memory. Volatile memories may include static random access memory (SRAM), pseudo-static random access memory (PSRAM), and dynamic random access memory (DRAM). DRAM types may include single data rate (SDR) DRAM, double data rate (DDR) DRAM, low power (LP) DDR DRAM, and any other types of DRAM. Nonvolatile memory types may include magnetic RAM (MRAM), flash memory, resistive RAM (RRAM), ferroelectric RAM (FeRAM), phase-change RAM (PRAM), electrically erasable programmable read-only memory (EEPROM), and any other types of nonvolatile memory.

In one embodiment, two or more data inputs of a memory chip may be coupled to a data output of a test device. In addition or as an alternative, two or more data outputs of the memory chip may be coupled to a data input of the test device. Under some conditions, this may have the advantage that the number of data outputs and inputs of the test device that are required for each memory chip to be tested is reduced without requiring memory-internal modifications. The memory-internal data path between the data inputs and outputs of the memory and the memory cells of the memory can be the same in a normal operating mode and in a test mode. To put it another way, a test mode where the data path differs from the normal operating mode with regard to the data path is not required for the memory chip.

As an example, two or four or eight or sixteen or thirty-two or sixty-four data inputs of the memory chip are coupled to a data output of the test device. In addition or as an alternative, two or four or eight or sixteen or thirty-two or sixty-four data outputs of the memory chip are coupled to a data input of the test device.

When reading out data written to memory cells for test purposes, in order to be able to determine or diagnose whether a logic 0 is present at each of the data outputs that are coupled in parallel externally or whether a logic 1 is present at each of the data outputs of the memory chip that are coupled in parallel externally, at each data input of the test device the signal level present at the respective data input may be compared with a first predetermined threshold level and with a second predetermined threshold level. The two predetermined threshold levels may be chosen such that they are undershot or exceeded, respectively, only when the same logic signal is present at all those data outputs of a memory chip that are coupled in parallel externally. When the signal level at the data input of the test device is below the first predetermined threshold level, it can be diagnosed, or determined, that a logic 0 is present at each of the data outputs of the memory chip that are coupled to the data input of the test device. When the signal level at the data input of the test device exceeds the second predetermined threshold level, it is diagnosed that a logic 1 is present at each of the data outputs of the memory chip that are coupled to the data input of the test device.

In accordance with one variant, from each group of data outputs of a memory chip that are coupled in parallel externally, one data output can be selected. For example, an output amplifier of the selected data output can be switched on, while the output amplifiers of the other data outputs of the same group may be switched off. As an alternative, the other data outputs may be disconnected or isolated from the respective output amplifiers or switched off in some other way.

Under some conditions, this variant may have the advantage that it constitutes only a minimal modification of the internal data path of the memory chip, but at the same time may enable a more precise localization of defective memory cells. In the case of applying the above described threshold levels, a further advantage may be that the predetermined threshold levels do not have to be adapted to the number of data outputs of a memory chip that are coupled in parallel externally.

In another embodiment, a register for storing test data may be coupled to a cell array of a memory by means of the same data bus by which input amplifiers of the memory are coupled to the cell array. This register may also be a register which can be used in an advanced compression test mode. It may be particularly advantageous to arrange the register in the memory in such a way that both the distance between the register and the cell array and the distance between the data inputs and outputs and the cell array are greater or very much greater than the distance between the register and the data inputs and outputs. Each distance can be understood to mean the line length between the respective reference points. In particular, the register can be arranged directly adjacent to the data inputs and outputs.

Under some conditions, this embodiment or a variant may provide the advantage that the data path between the register and the cell array is very similar or essentially equal to the data path between the data inputs and outputs of the memory chip and the cell array of the memory chip. Thus, faults in the data path of the normal operating mode are also largely detected in the test of the memory chip.

The register and the data bus may be configured for transferring data between the register and the cell array at the same maximum data rate at which data can be exchanged between the data inputs and outputs and the cell array in the normal operating mode.

The register and the data bus may also be configured for transferring, in a test mode of the integrated device, data between the register and the cell array at the same data rate at which data can be exchanged between the data inputs and outputs and the cell array in the normal operating mode of the integrated device.

Figure 1:
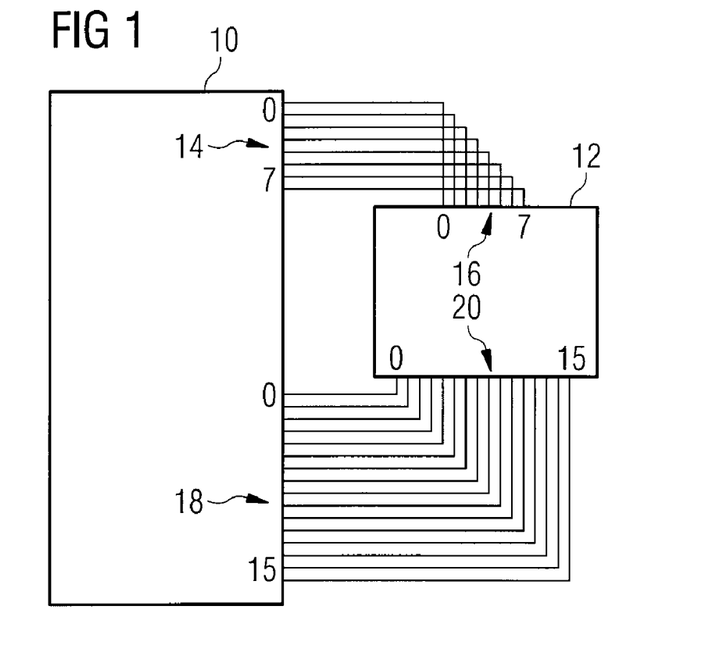
FIG. 1 shows a schematic circuit diagram of a test device and of a memory chip.

FIG. 1 is a schematic circuit diagram showing a conventional test system coupling a test device 10 to a memory chip 12. The test device 10 has a plurality of address outputs 14 coupled to a plurality of address inputs 16 of the memory chip 12, and a plurality of data inputs and outputs 18 coupled to a plurality of data inputs and outputs 20 of the memory chip 12. It is assumed in this example and all the subsequent examples that each of the test device 10 and the memory chip 12 has eight address outputs and inputs and sixteen data inputs and outputs. The inputs and outputs are usually numbered consecutively, in which case in FIG. 1 and the subsequent figures only the first and the last input or output are respectively provided with the numbers 0 and 7, and 0 and 15.

In FIG. 1, each input or output 16, 20 of the memory chip 12 is coupled to a corresponding input or output 14, 18 of the test device 10. The memory chip 12 is therefore coupled in the same way as in a normal operating mode. The test device 10 can address any desired address in the address space of the memory chip 12 by means of corresponding signals via its address outputs 14 and the address inputs 16 of the memory chip 12. Via the data inputs and outputs 18 of the test device 10 and the data inputs and outputs 20 of the memory chip 12, any desired datum or any desired number can be written to any desired selected address or be read from said address. Overall, therefore, any desired bit pattern can be written to memory cells of the memory chip 12 and be read from said memory cells by the test device. In this case, the memory chip 12 is in the same operating mode in which it is operated subsequently.

Figure 2:
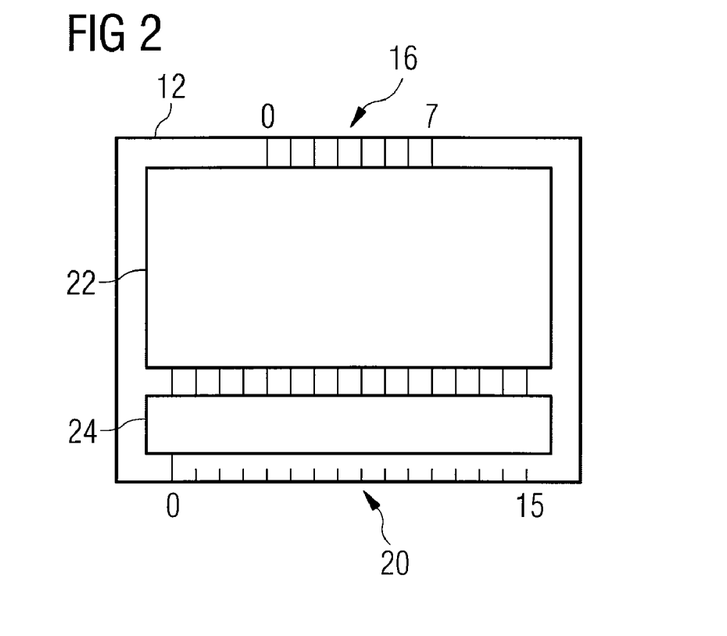
FIG. 2 shows a schematic circuit diagram of a memory chip.

FIG. 2 is a schematic illustration of a memory chip 12 having a cell array 22 like the memory chip 12 from FIG. 1, said cell array not being illustrated, however, in FIG. 1. The data inputs and outputs 20 of the memory chip 12 are coupled directly to the cell array 22 only in a normal operating mode (not illustrated in FIG. 2). In a test mode of the memory chip 12, a test logic 24 is coupled between the cell array 22 and the data inputs and outputs 20 of the memory chip 12 (illustrated in FIG. 2). The test logic 24 comprises one or more registers (not illustrated in FIG. 2) and may be only coupled to one data input and output 20 of the memory chip 12. Any desired bit patterns can be written to the register or registers of the test logic 24 via said one data input and output 20. Subsequently, the test logic 24 writes said bit patterns to memory cells at any desired addresses of the cell array 22, the respective address being controlled by an address signal at the address inputs 16 of the memory chip 12. Afterward, the content of the memory cells is read out again and compared with the previously written bit pattern in the test logic 24.

Differences between the bit pattern written to the memory cells and the bit pattern read from the memory cells indicate a fault of the cell array 22 at the corresponding address and are signaled externally via the one data input and output 20 of the memory chip 12.

Figure 3:
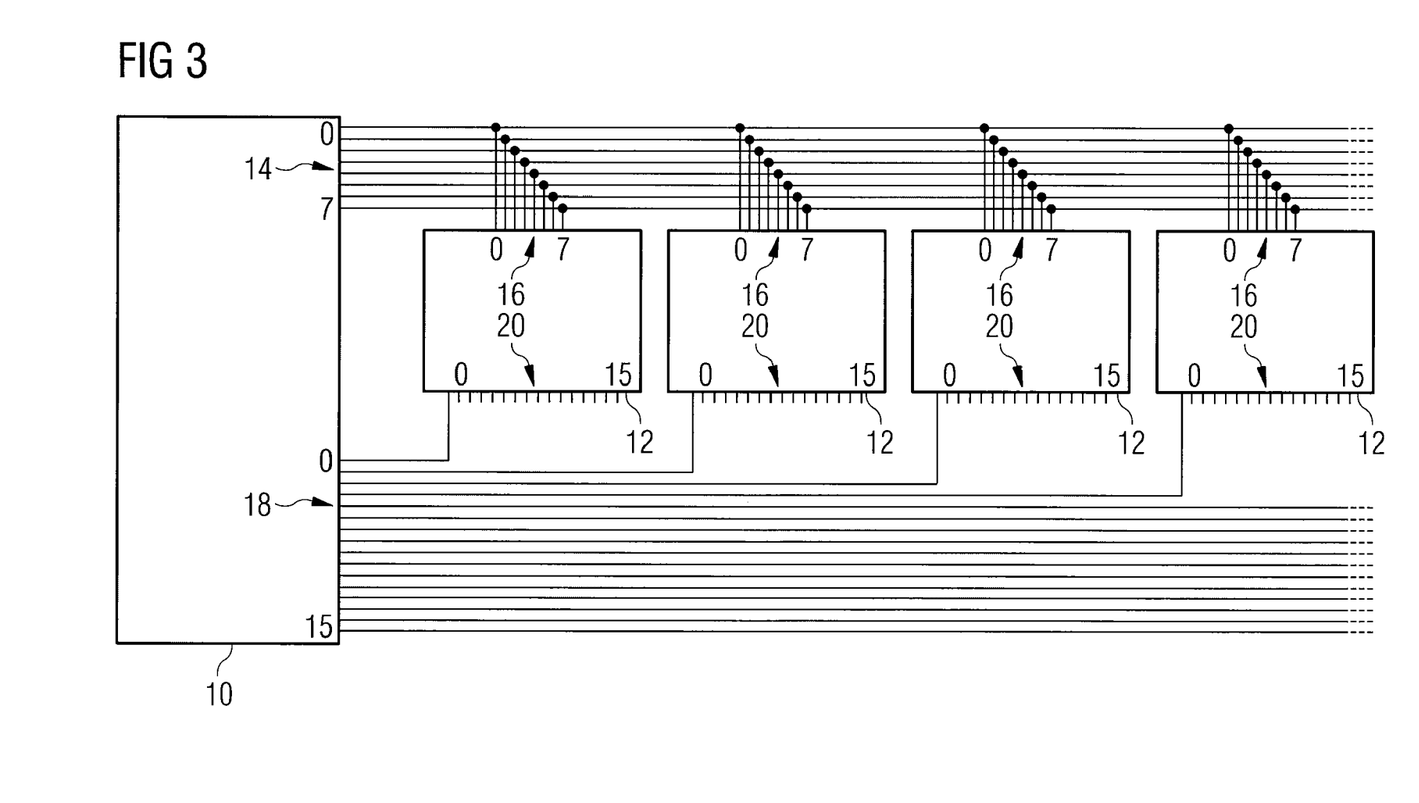
FIG. 3 shows a schematic circuit diagram of a test device and of a plurality of memory chips.

The described test mode using the test logic 24 is also referred to as advanced compression test mode (ACTM). Under some condition, it may have an advantage over the test of a memory chip in its normal operating mode as illustrated above with reference to FIG. 1, said potential advantage becoming clear in the schematic circuit diagram illustrated in FIG. 3. Since each memory chip 12 may be coupled to the test device 10 only via one data input and output 20 in the ACTM, the test device 10 can simultaneously be coupled to a plurality of memory chips 12. The address outputs 14 of the test device 10 are coupled to the address inputs 16 of all the memory chips in parallel. Each memory chip 12 is coupled to a single data input and output 18 of the test device 10.

With the described interconnection, a plurality of memory chips 12 (in this case, 16 memory chips) can be tested simultaneously by means of one test device 10. As long as faults of the memory chip are exclusively faults of the memory cells, it is possible to test a significantly higher number of memory chips 12 in the same time with the interconnection from FIG. 3 and the ACTM with a specific number of test devices 10. It is foreseeable, however, that with increasing miniaturization and ever higher data rates during writing and reading operations, faults can also occur in the data path between the data inputs and outputs 20 and the memory cells. Sources of error in this data path are not covered or are only covered incompletely by means of the ACTM, however, since large parts of the data path used in the normal operating mode are replaced by the test logic 24 in the ACTM.

Figure 4:
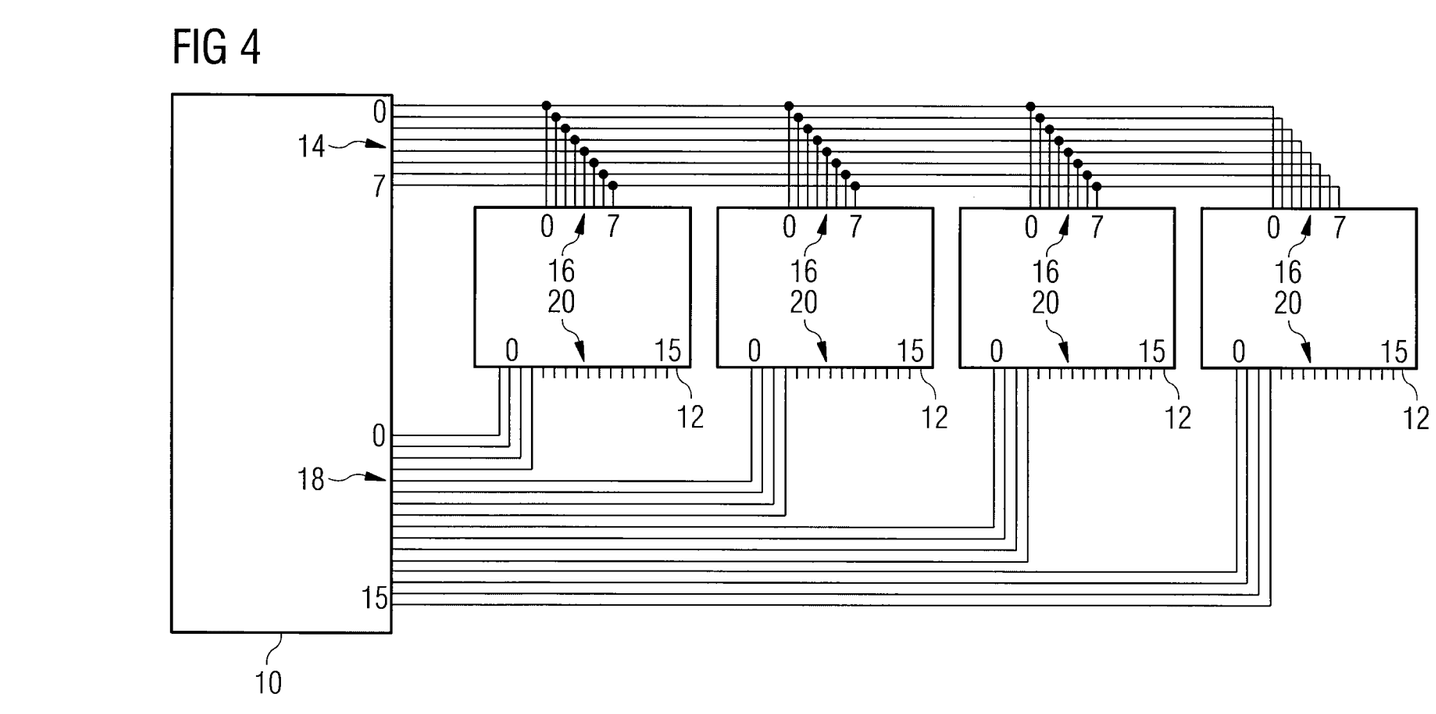
FIG. 4 shows a schematic circuit diagram of a test device and of a plurality of memory chips.

FIG. 4 is a schematic circuit diagram illustrating an alternative conventional coupling of a plurality of memory chips 12 to a test circuit 10. In a manner similar to that in FIG. 3, the address inputs 16 of all the memory chips 12 are coupled to the address outputs 14 of the test device 10 in parallel. In each case, four data inputs and outputs 20 (0, 1, 2, 3) of each memory chip 12 are coupled to four data inputs and outputs 18 (0, 1, 2, 3 and 4, 5, 6, 7 and 8, 9, 10, 11 and 12, 13, 14, 15, respectively) of the test device 10.

For the test circuitry illustrated in FIG. 4, each memory chip 12 must contain at its data inputs and outputs 20 circuits which make it possible to internally couple those data inputs and outputs 20 of the memory chip 12, which are not externally coupled to the data inputs and outputs 18 of the test device 10, to those data inputs and outputs of the memory chip 12 which are coupled externally to data inputs and outputs 18 of the test device 10. By way of example, in each case the following data inputs and outputs 20 of a memory chip 12 can be coupled in parallel internally in the test mode: 0, 4, 8, 12; 1, 5, 9, 13; 2, 6, 10, 14; 3, 7, 11, 15. This test mode is also referred to as TMx4.

A drawback of the TMx4, similarly to the ACTM, may be that the internal data path in each memory chip 12 in the TMx4 does not correspond to that in the normal operating mode.

Figure 5:
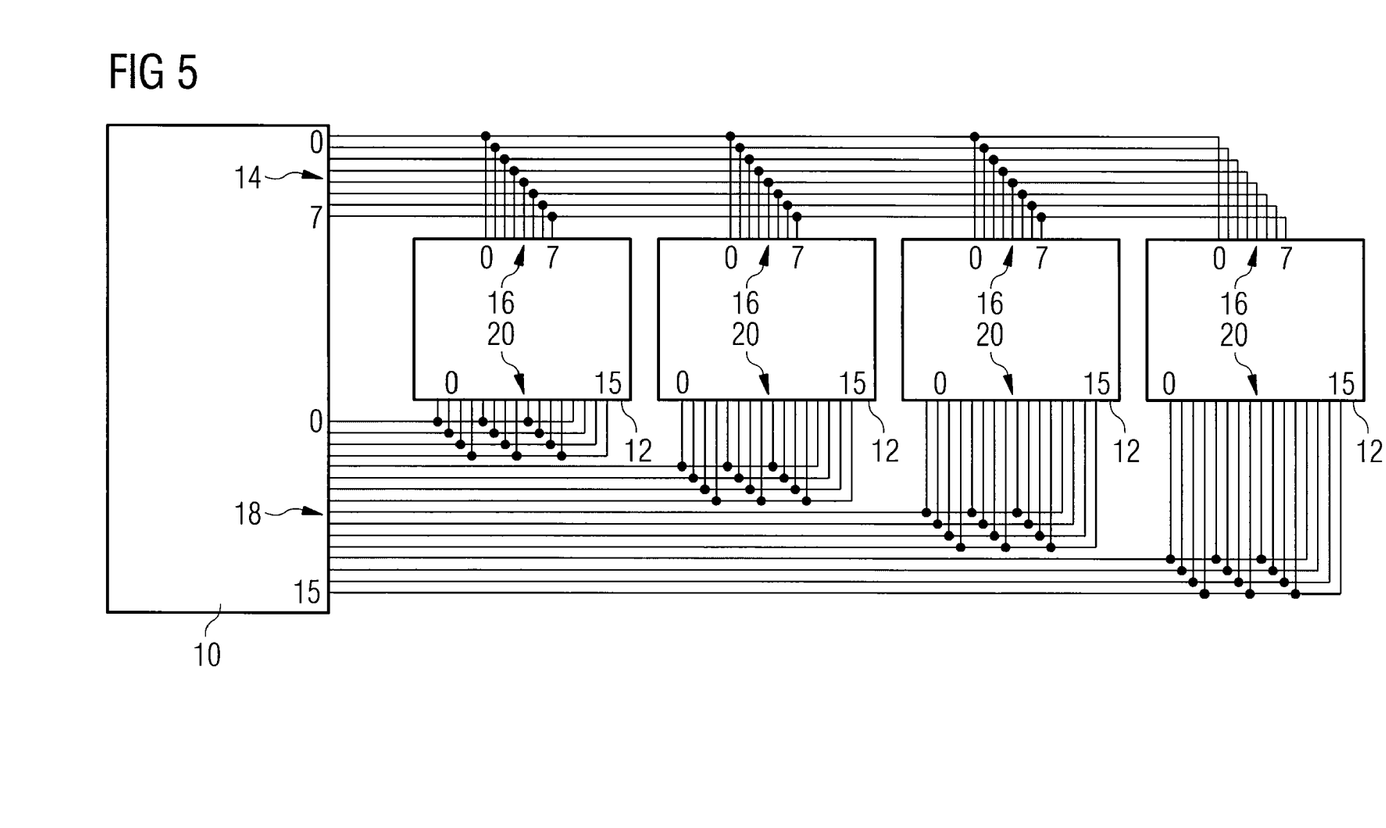
FIG. 5 shows a schematic circuit diagram of a test device and of a plurality of memory chips.

FIG. 5 is a schematic circuit diagram illustrating a test device 10 and a plurality of memory chips 12 in an arrangement for testing the memory chips 12. Address outputs 14 of the test device 10 are coupled to address inputs 16 of the memory chips. To each of the address outputs 14 of the test device 10 mutually corresponding address inputs of the memory chips 12 are coupled in parallel.

In contrast to the arrangements illustrated above with reference to FIGS. 3 and 4, in each case here, a plurality of data inputs and outputs 20 of a memory chip 12 may be coupled to one and the same data input and output 18 of the test device 10. Each data input and output 18 of the test device 10 may have an input and output amplifier (not illustrated in the figures), respectively, and may be coupled to a plurality of data inputs and outputs 20 of precisely one memory chip 12.

In one embodiment, each data input and output 18 of the test device 10 may be coupled to a plurality of input and output terminals (not illustrated in the figures) of the memory chip 12, respectively. Here, each of the plurality of input and output terminals may be configured to be coupled to a respective data input and output 18 of the memory chip 12.

In the present example, inter alia the following data inputs and outputs 20 of the first memory chip 12 illustrated on the far left, are coupled to the data input and output 18 having the number 0 of the test device: 0, 4, 8, 12. The data inputs and outputs 20 having the numbers 1, 5, 9 and 13 of the first memory chip 12 are coupled to the data input and output 18 having the number 1 of the test device 10. The same applies correspondingly to the rest of the data inputs and outputs 20 of the first memory chip 12 and to the data inputs and outputs 20 of the further memory chips 12 and to the data inputs and outputs 18 having the numbers 2 to 15 of the test device 10. Consequently, at each memory chip 12, the data inputs and outputs 20 having the numbers 0, 4, 8 and 12 are externally short-circuited, or coupled in parallel; the data inputs and outputs 20 having the numbers 1, 5, 9 and 13 are coupled in parallel with one another; the data inputs and outputs 20 having the numbers 2, 6, 10 and 14 are externally coupled in parallel with one another; and the data inputs and outputs 20 having the numbers 3, 7, 11 and 15 are externally coupled in parallel with one another.

The test device 10 is coupled to the memory chips by means of one or more needle cards, sockets or other suitable connections or coupling means by means of which contact is made with the memory chips 12. These connections are not illustrated explicitly in the figures. The described external parallel coupling of a plurality of data inputs and outputs of each memory chip is effected by means of a corresponding wiring of the test device 10 with the coupling means. As an alternative to the arrangement illustrated in FIG. 5, the connections and the wiring between the test device 10 or the input and output amplifiers thereof and the connections for the memory chips can be regarded as part of the test device 10.

Thus, in the case of an internal organization of the memory chip in a manner such that in each case four memory cells are organized in a column select line (CSL) (or the corresponding write and read amplifiers are coupled to a CSL), the memory cells of four CSLs in each case have the same data written to them or are read simultaneously.

Figures 6, 7:
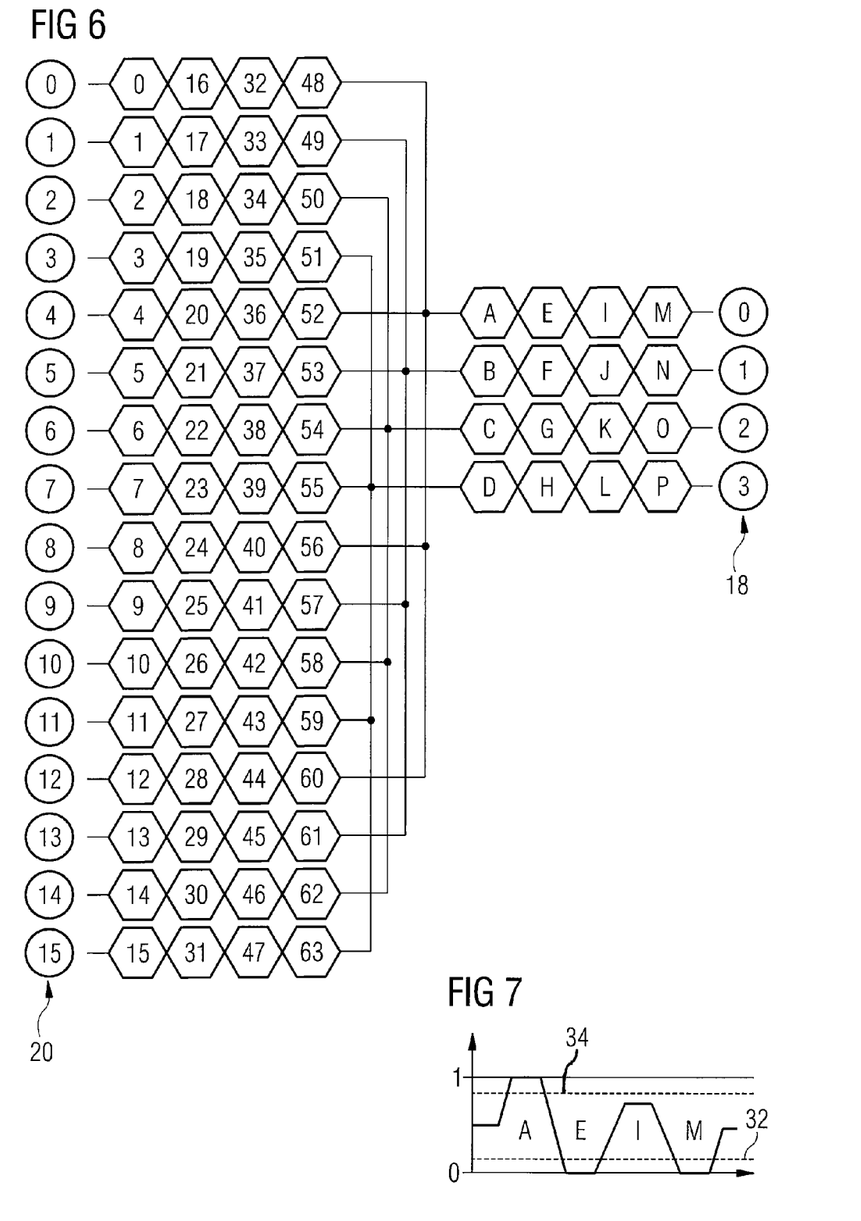
FIG. 6 shows a schematic illustration of signals in the arrangement from FIG. 5.
FIG. 7 shows a schematic illustration of a signal in the arrangement from FIG. 5.

FIG. 6 is a schematic illustration of signals at the data inputs and outputs 20 of a memory chip 12 and at the data inputs and outputs 18 of the test device 10. The left-hand part of FIG. 6 illustrates in each row the signals at a respective one of the data inputs and outputs 20 of the memory chip 12. The numbers indicated in circles on the far left represent the numbers of the respective data inputs and outputs 20 of the memory chip 12.

The right-hand part of FIG. 6 illustrates in each of four rows the signals present at a respective data input and output 18 of the test device 10. The numbers illustrated in circles on the far right represent the numbers of the respective data inputs and outputs 18 of the test device 10. Since this example relates to the memory chip 12 illustrated on the far left in FIG. 5, the numbers of the data inputs and outputs 18 of the test device 10 read 0, 1, 2, 3.

The numbers and letters in the data eyes illustrated as hexagons identify the individual bits, or the signals representing said bits. By way of example, signals representing the bits 0, 16, 32 and 48 are present successively at the data input and output 20 having the number 0 of the memory chip 12. The signals A, E, I and M are present successively at the data input and output 18 having the number 0 of the test device 10. The arrangement from left to right indicates in each case the temporal order of the signals.

The sequence of in each case four signals (for example the signals 0, 16, 32, 48 or the signals A, E, I, M) represents the situation in the case of a burst length of four, in which, responsive to a read access, in a burst four bits are output successively via each data input and output 20.

Due to the external parallel connection of, in each case, a plurality of data inputs and outputs 20 of the memory chip 12 as illustrated above with reference to FIG. 5, each signal at one of the data inputs and outputs 18 of the test device 10 is a superposition or sum of signals at a respective plurality of data inputs and outputs 20 of the memory chip. This is symbolized by lines and nodes between the left-hand and right-hand sections of FIG. 6. By way of example, the signal A is a sum or superposition of the signals 0, 4, 8 and 12, the signal B is a sum or superposition of the signals 1, 5, 9 and 13, the signal E is a sum or superposition of the signals 16, 20, 24 and 28, and the signal P is a sum or superposition of the signals 51, 55, 59 and 63.

FIG. 7 is a schematic illustration of an example of a signal sequence at one of the data inputs and outputs 18 of the test device 10. Time is assigned to the abscissa, and the signal level is assigned to the ordinate. The signal level corresponding to a logic 0 is identified by a 0, and the signal level corresponding to a logic 1 is identified by a 1.

It is assumed as an example that a 1 had been written to each of the memory cells whose read-out content is represented by the signals 0, 4, 8, 12, 32, 36, 40, 44, and that a 0 had been written to each of the memory cells whose read-out content is represented by the signals 16, 20, 24, 28, 48, 52, 56, 60. When these memory cells are free of faults and both the signal path (or data path) from the data inputs to the memory cells and the data path from the memory cells through the data outputs function without any faults, each of the signals 0, 4, 8, 12, 32, 36, 40, 44 represent a 1 and each of the signals 16, 20, 24, 28, 48, 52, 56, 60 represent a 0. Consequently, in this case each of the signals A and I represents a 1 and each of the signals E and M represents a 0.

It can be discerned in FIG. 7, however, that the signal I reaches only approximately ¾ of the signal level corresponding to a logic 1. Therefore, it can be deduced that one of the cells whose read-out content is represented by the signals 32, 36, 40, 44 is faulty.

In order to detect such an event, the signal level can be compared with two predetermined threshold levels 32, 34. The threshold values are set or selected such that the signal level lies below the first predetermined threshold level 32 only when all the individual signals representing the data read from the memory cells represent a logic 0, and that the signal level lies above the second predetermined threshold level 34 only when all the individual signals represent a logic 1.

When the signal level at the data input 18 of the test device 10 is below the first threshold level 32 or exceeds the second threshold level 34 and it is thus established that the same value was read out from all the memory cells whose read signals contribute to the signal level. In this case, said value is compared with the value originally written to the memory cells. At least one of the respective memory cells is faulty when the signal level neither falls below the first predetermined threshold level 32 nor exceeds the second predetermined threshold level 34 or when a 0 had been written to the memory cells but the signal level exceeds the second predetermined threshold level 34, or when a 1 had been written to the memory cells and the signal level falls below the first predetermined threshold level.

The comparison of the signal level present at the data input 18 of the test device 10 with the predetermined threshold levels 32, 34, and the comparison with the values originally written to the memory cells may be effected in the test device 10.

Figure 8:
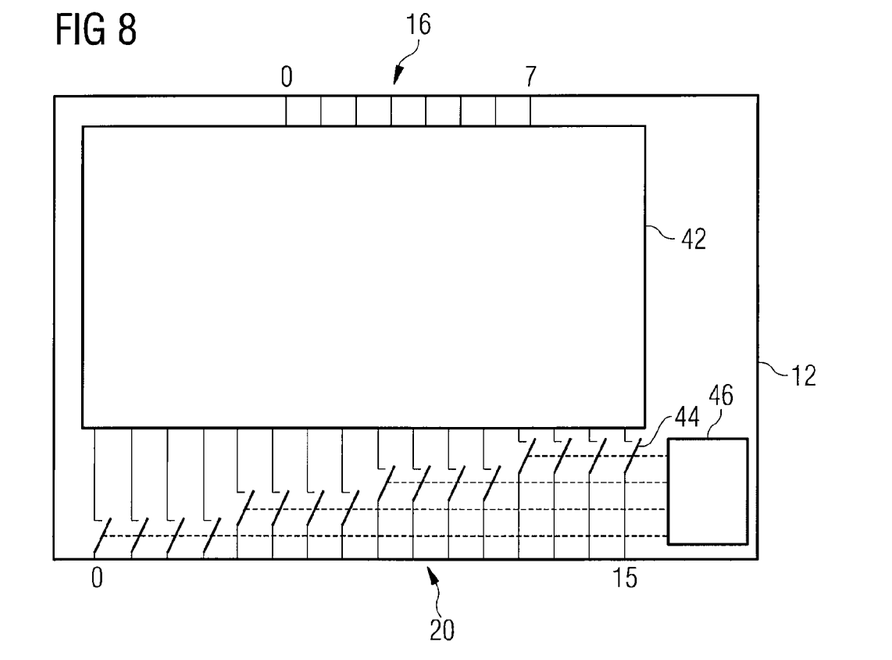
FIG. 8 shows a schematic circuit diagram of a memory chip.

FIG. 8 is a schematic circuit diagram of a memory chip 12 with which the test method described above with reference to FIGS. 5 to 7 may be modified and, under some conditions, even may be improved. The memory chip 12 comprises a memory circuit 42 with input and output amplifiers, address bus, address decoders, memory cells, write and read amplifiers and further components that are not illustrated individually in FIG. 8. The memory circuit 42 is coupled to the address input 16 of the memory chip 12 and, via a plurality of switches 44, to the data inputs and outputs 20 of the memory chip 12. By means of each switch 44, the memory circuit 42 can be disconnected from one of the data inputs and outputs 20 of the memory chip 12. A control device 46 is operatively coupled to the switches 44. In each case, four switches 44 form a group and are driven simultaneously and in the same sense by means of the control device 46. As a result, groups of data inputs and outputs 20 of the memory chip 12 having the following numbers can be simultaneously coupled to the memory circuit 42 or isolated from it: 0, 1, 2, 3; 4, 5, 6, 7; 8, 9, 10, 11; 12, 13, 14, 15. The isolation of a data input and output 20 from the memory circuit 42 is tantamount to a turning off of said data input and output 20.

With the switching device formed by the control device 46 and the switches 44, despite the external parallel coupling of respective pluralities of data inputs and outputs 20 of the memory chip as illustrated above with reference to FIG. 5, data can be written to and read from each individual memory cell of the memory chip 12 independently of one another.

It may be advantageous to firstly carry out the test method described above with reference to FIGS. 5 to 7. When it is recognized during said test method that a fault is present in a group of memory cells, the defective memory cell or the defective memory cells from said group can be identified by a procedure in which, during further tests, under the control of the control device 46, only the switches 44 of one group are closed and the switches 44 of the other groups are open.

As an alternative, the test method illustrated above with reference to FIGS. 5 to 7 is carried out four times, wherein, under the control of the control device 46, only one of the groups of switches 44 is closed each time the test method is carried out. Under some conditions, this method may provide the advantage that, unlike the above explanation with reference to FIG. 7, the threshold levels 32, 34 do not have to be adapted to the number of parallel-coupled data inputs and outputs 20 of the memory chip.

Under some conditions, the test of a memory chip such as is illustrated in FIG. 4, may provide an advantage when compared to an ACTM or TMx4. One advantage may be that the signal paths are only minimally influenced by insertion of the switches 44 (for example field effect transistors).

Figure 9:
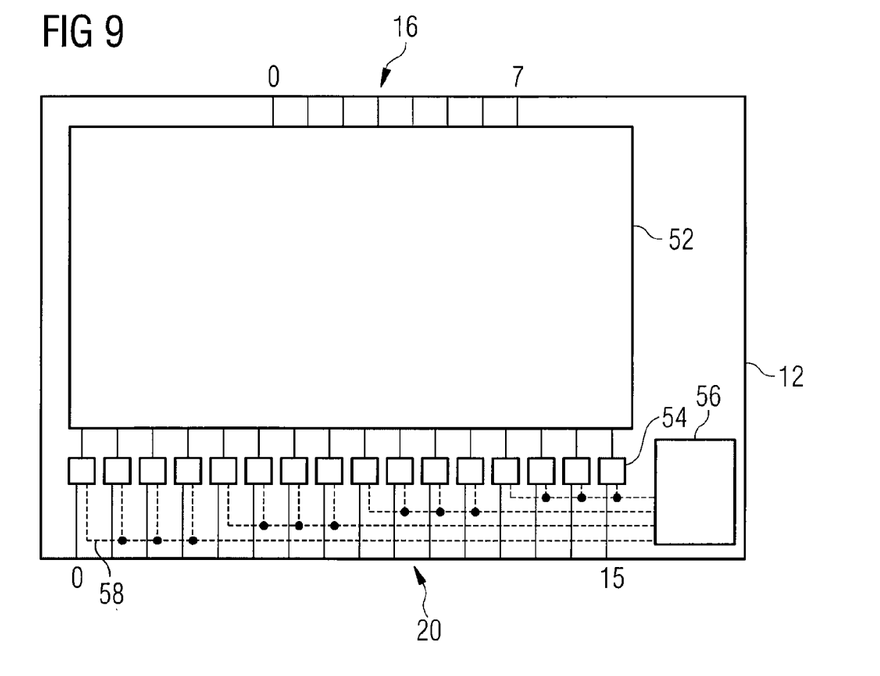
FIG. 9 shows a schematic illustration of a further memory chip.

FIG. 9 is a schematic circuit diagram of a further memory chip 12 with which the test method illustrated above with reference to FIGS. 5 to 7 can be improved. Here the memory chip 12 comprises a memory circuit 52 with address bus, address decoder, data bus, registers, memory cells, write and read amplifiers and further components which are not illustrated individually in FIG. 9. Input and output amplifiers 54 are illustrated separately between the data inputs and outputs 20 of the memory chip 12 and the memory circuit 52.

The input and output amplifiers 54 are supplied with electrical power by a switching device 56 via supply lines 58. In each case four input and output amplifiers 54 are combined to form a group and are supplied with electrical power by the switching device 56 via one and the same supply line 58. Supplying electrical power to an input and output amplifier 54 can result in operative coupling of the memory circuit 52 to the corresponding data input and output 20 of the memory chip. Turning off the power supply for one of the input and output amplifiers 54 by means of the switching device 56 is tantamount to disconnecting of the memory circuit 52 from the corresponding data input and output 20 of the memory chip 12 or to a turning off of the corresponding data input and output 20 of the memory chip 12.

The test method illustrated above with reference to FIGS. 5 to 7 can be supplemented or modified with a memory chip such as is illustrated in FIG. 9 in the same way as has been described above with reference to the memory chip illustrated in FIG. 8. Some advantages also may exist and may correspond to those illustrated above for FIG. 8. In particular it also may hold true for the memory chip illustrated with reference to FIG. 9 that the signal path between data inputs and outputs 20 of the memory chip and the memory circuit 52 in the test mode experiences only a minimal modification by comparison with a normal operating mode. For each memory chip 12 illustrated with reference to FIGS. 8 and 9, the signal path between a turned-on data input and output 20 and the memory circuit 42 and 52 may remain completely unchanged by comparison with a normal operating mode.

Figure 10:
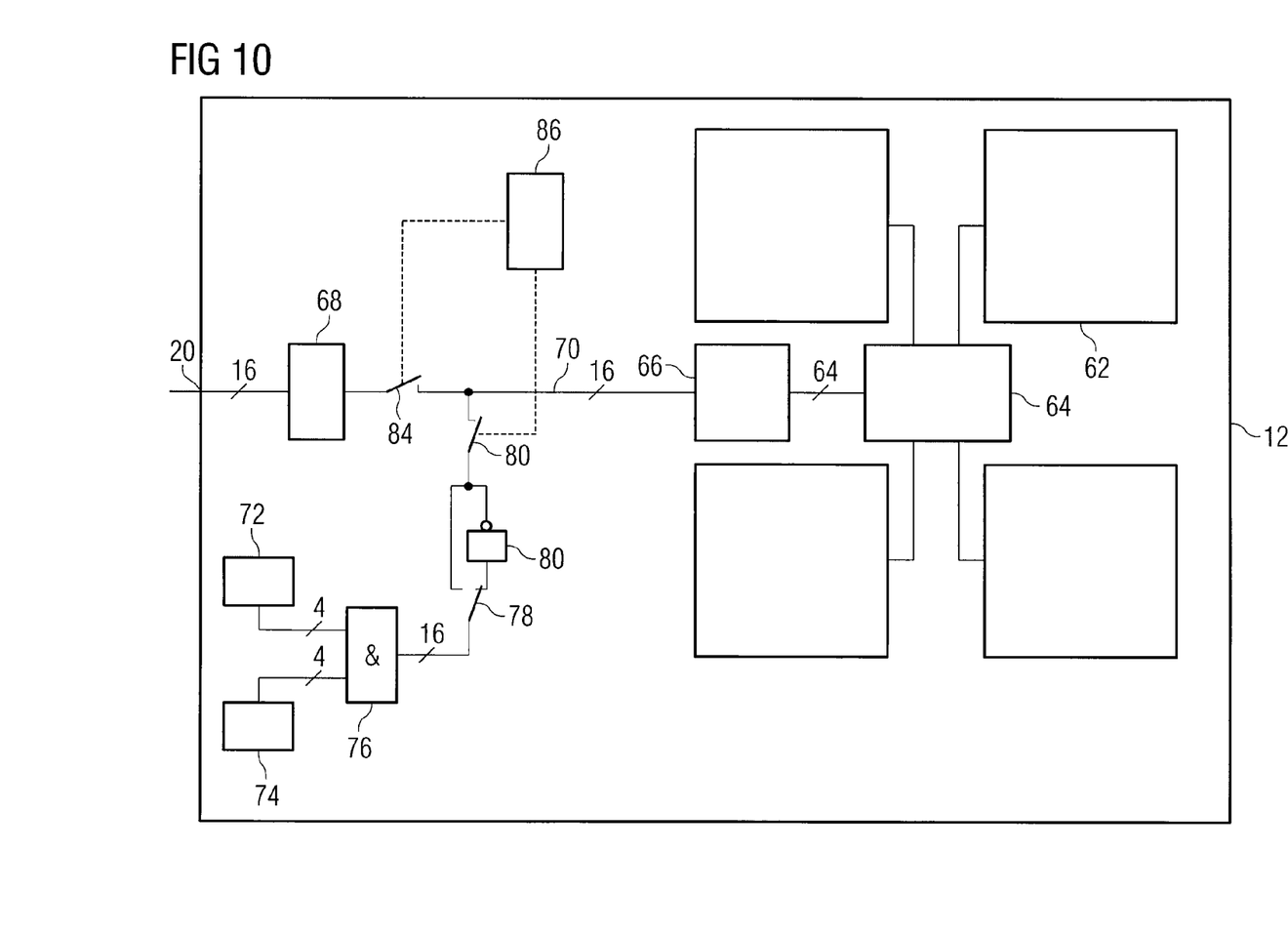
FIG. 10 shows a schematic illustration of a further memory chip.

FIG. 10 is a schematic illustration of a further memory chip 12 with a plurality of memory areas or memory banks 62. Each of the memory areas or memory banks 62 comprises one or more arrays of memory cells. All the memory areas or memory banks 62 together form the cell array or cell arrays of the memory chip 12. The memory banks 62 are coupled to data inputs and outputs of the memory chip 12 via a data path control 64, an input/output logic 66 (I/O logic) and input and output amplifiers 68. In the example illustrated, the data path control 64 is coupled to the input/output logic 66 via 64 parallel lines and the input/output logic 66 is coupled to the input and output amplifiers 68 via 16 parallel data lines. The memory chip 12 has 16 parallel data inputs and outputs 20 coupled to the input and output amplifiers 68. Coupling means between the input/output logic 66 and the input and output amplifiers 68 is referred to hereinafter as data bus 70. The data bus 70 together with the input/output logic 66, the coupling thereof to the data path control 64, the data path control 64 and the coupling thereof to the memory banks 62 forms an internal data path of the memory chip 12.

The memory chip 12 furthermore has registers 72, 74, each of which can store four bits and each of which is coupled to a multiplier 76 via four parallel data lines. The multiplier 76 is coupled to the data bus 70 via 16 parallel data lines, in which a changeover switch 78 is arranged, and via a switch 80. By means of the changeover switch 78, the multiplier 76 can be coupled either directly or via an inverter to the switch 80 and via the latter to the data bus 70. The inverter 82 inverts each signal on each of the 16 parallel data lines. A further switch 84 is arranged between the input and output amplifiers 68 and the data bus 70, by means of which further switch the input and output amplifiers 68 can be disconnected from the data bus 70. The changeover switch 78, the switch 80 and the switch 84 each comprises 16 individual switches which can be actuated simultaneously and in the same sense. Each of the individual switches switches a respective one of the 16 parallel data lines.

In a normal operating mode of the memory chip 12, the switches 80, 84 may be controlled by a control device 86 in such a way that the input amplifiers 68 are coupled to the data bus 70, and the registers 72, 74 and the multiplier 76 are disconnected from the data bus. In contrast, in a test mode of the memory chip 12, the switches 80, 84 maybe controlled by a control device 86 in such a way that the input amplifiers 68 may be disconnected from the data bus 70 and the registers 72, 74 and the multiplier 76 are coupled to the data bus.

Therefore, in the normal operating mode of the memory chip 12, the switch 84 is closed and the switch 80 is open. As a result, data received via the data input and output 20 (and subsequently received by the input and output amplifiers 68) may be stored in memory cells of the memory banks 62 via the data bus 70, the input/output logic 66 and the data path control 64. Furthermore, data read from memory cells of the memory banks 62 can be outputted via the data path control 64, the input/output logic 66, the data bus 70, the input and output amplifiers 68 and the data inputs and outputs 20 of the memory chip 12.

In a test mode, predetermined bit patterns can be loaded into the registers 72, 74. The multiplier 76 generates 16 output signals from the 4 bits of each of the two registers 72, 74 by means of 16 individual logic AND operations. Accordingly, bit 0 of the first register 72 may be an input variable of the logic AND operations 0, 4, 8, 12; bit 1 of the first register 72 may be an input variable of the logic AND operations 1, 5, 9, 13; bit 2 of the first register 72 may be an input variable of the logic AND operations 2, 6, 10, 14; bit 3 of the first register 72 may be an input variable of the logic AND operations 3, 7, 11, 15; bit 0 of the second register 74 may be an input variable of the logic AND operations 0, 1, 2, 3; bit 1 of the second register 74 may be an input variable of the logic AND operations 4, 5, 6, 7; bit 2 of the second register 74 may be an input variable of the logic AND operations 8, 9, 10, 11; and bit 3 of the second register 74 may be an input variable of the logic AND operations 12, 13, 14, 15. Together with the optional inversion, controlled by the changeover switch 78, by the inverter 82, it may be thus possible to apply a large number of different bit patterns to the data bus 70.

When the desired bit patterns have been loaded into the registers 72, 74, the switch 84 can be opened and the switch 80 can be closed. Subsequently, data can be generated by the registers 72, 74, the multiplier 76 and optionally the inverter 82, as previously described, and may be transferred via the data bus 70, the input/output logic 66 and the data path control 64 and stored in memory cells of the memory banks 62. The stored data may then be read from the memory cells of the memory banks 62, via the data path control 64, the input/output logic 66, the data bus 70 and optionally the inverter 82 and, with the registers 72, 74 and the multiplier 76. Thereafter, the data read from the memory cells of the memory banks 62 can be compared with the data originally stored in the memory cells, in order to test the functionality of the memory cells and, when present, to identify faulty memory cells.

Registers 72, 74 for generating test data are conventionally arranged in the memory array, for example in the input/output logic 66. Alternatively, as illustrated in the memory chip of FIG. 10, the registers 72, 74 may also be arranged directly adjacent to the input and output amplifiers 68. As a result, the distances and line lengths between the registers 72, 74 and the memory banks 62 and also the distances and line lengths between the input and output amplifiers 68 and the memory banks 62 are significantly greater than the distance between the registers 72, 74 and the input and output amplifiers 68. The same data bus 70, and thus overall largely the same data path, are used both in the normal operating mode for the transfer of data between data inputs and outputs 20 and the memory banks 62 of the memory chip 12, and in a test mode for the transfer of test data between the registers 72, 74 and the memory banks 62. A high test coverage can thereby be achieved. By way of example, faults of the memory chip 12 in the input/output logic 66 or in the data bus 70 may also be identified in a functional test in this way. Only faults in the input and output amplifiers 68 would not be identified, but can be identified by other tests that are carried out.

Figure 11:
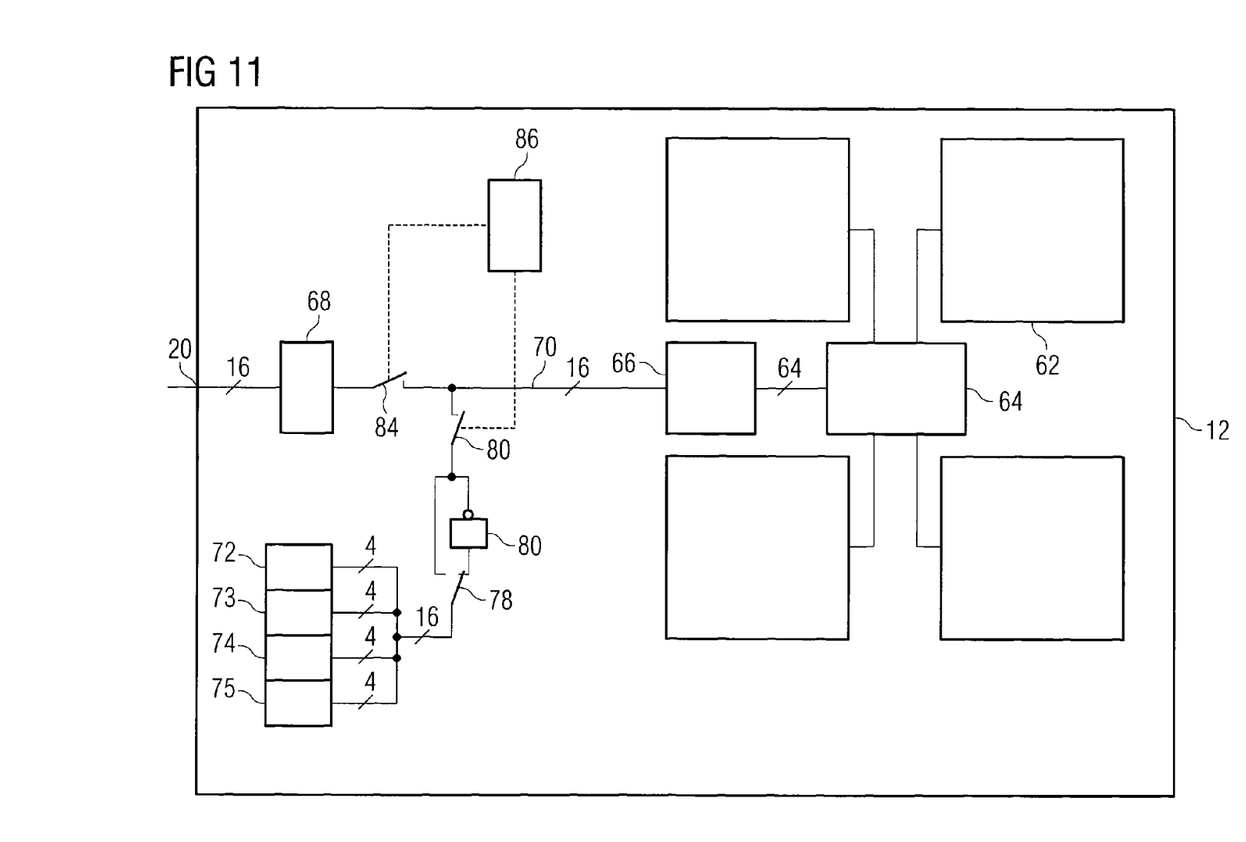
FIG. 11 shows a schematic illustration of a further memory chip.

FIG. 11 is a schematic circuit diagram of a further memory chip 12, which differs from the memory chip illustrated above with reference to FIG. 10 by virtue of the fact that test data are generated by four registers with four bits in each case. Therefore, a multiplier is not required.

The exemplary embodiments illustrated above can be varied in many ways. In particular, the number of address outputs 14 of the test device 10, the number of address inputs 16 of the memory chips 12, the number of data inputs and outputs 18 of the test device 10, the number of data inputs and outputs 20 of the memory chips 12, the number of data inputs and outputs that are in each case coupled in parallel externally, the number of memory chips 12 tested simultaneously by means of a test device 10, the burst length, the number of switches 44 in a group which are controlled simultaneously by the control device 46, the number of input and output amplifiers 54 which are supplied with electrical power in a group jointly via a supply line 58, the number of input and output amplifiers 54 the power supply of which is jointly switched, the number of memory banks 62, the number of parallel data lines between data path control 64 and input/output logic 66, the number of parallel data lines in the data bus 70, the number of registers 72, 73, 74, 75 and the number of bits per register can deviate both upwardly and downwardly in each case from the examples illustrated above.

By way of example, with the test methods illustrated above with reference to FIGS. 5 to 9, at each point in time it is also possible for just one memory chip 12 to be tested by the test device 10. In this case, the number of data inputs and outputs 20 of the memory chip 12 can be greater or significantly greater than the number of data inputs and outputs 18 of the test device 10. Furthermore, the test methods described above may be applied not only to DRAM memory chips but also to memory chips of other technologies. For example, to memory chips having separate data inputs and separate data outputs. The test methods described above may be conducted both for tests before and after cleaving a wafer into single memory chips and for tests after packaging.

Figure 12:
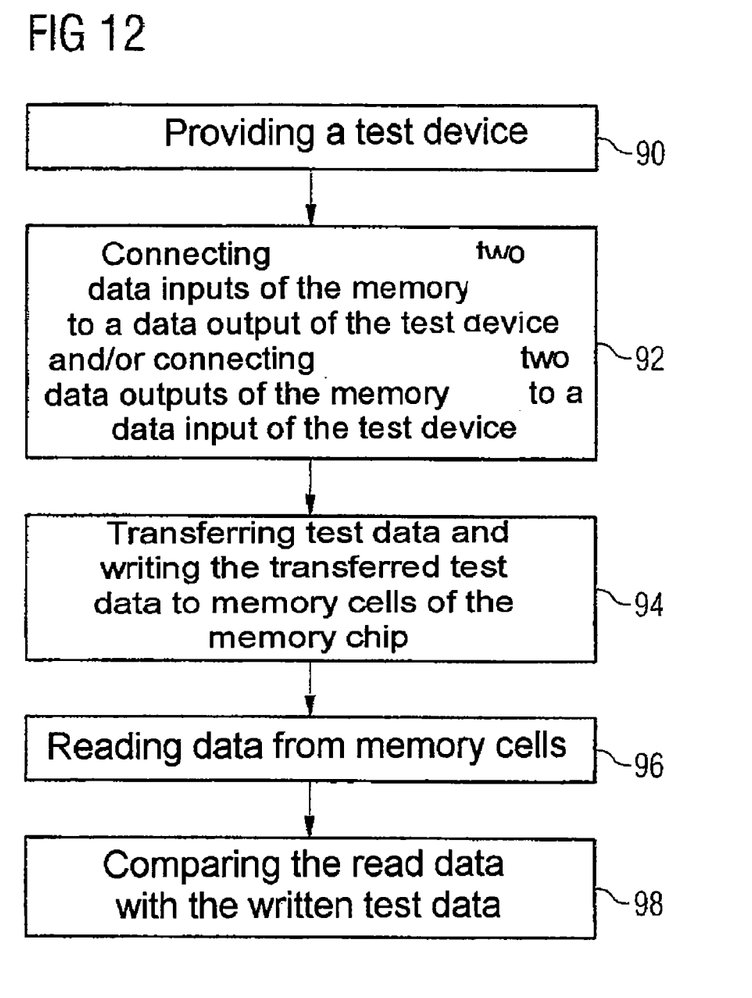
FIG. 12 shows a schematic flowchart of a method for testing a memory chip.

FIG. 12 is a schematic flowchart of a method for testing a memory chip such as has already been illustrated above with reference to FIGS. 5 to 9. Although the method may be applied to other integrated devices comprising memory, reference numerals from the above described embodiments will be used in an exemplary way in order to facilitate understanding of the method.

In a first step 90, a test device 10 is provided. In a second step 92, in each case two data inputs 20 of the memory chip 12 may be coupled to one data output 18 of the test device 10 and/or in each case two data outputs 20 of the memory chip 12 may be coupled to one data input 18 of the test device 10. In a third step 94, test data of the test device 10 may be transferred to the memory chip 12 and the transferred test data may be written to memory cells of the memory chip 12. When two (or more) data inputs 20 of the memory chip 12 are coupled to a data output 18 of the test device 10, the same data may be written to a plurality of memory cells of the memory chip. In a fourth step 96, data may be read from memory cells of the memory chip 12 and the read data may be transferred from the memory chip 12 to the test device 10. In a fifth step 98, the data read from the memory chip 12 may be compared with the test data written to the memory chip 12 in order to identify faults of the memory chip 12.

When a respective plurality of data outputs 20 of the memory chip 12 are coupled to each data input 18 of the test device 10, the step of comparing may comprise, as described above with reference to FIGS. 6 and 7, comparing the signal level at a data input 18 of the test device 10 with a first predetermined threshold level and with a second predetermined threshold level. When the signal level at the data input 18 of the test device 10 falls below the first predetermined threshold level, it can be diagnosed that a logic 0 is present at each of the data outputs 20 of the memory chip 12 which are coupled to the relevant data input 18 of the test device 10. When the signal level at the data input 18 of the test device 10 exceeds the second predetermined threshold level 34, it can be diagnosed that a logic 1 is present at each of the data outputs 20 of the memory chip 12 which are coupled to the relevant data input 18 of the test device 10.

Figure 13:
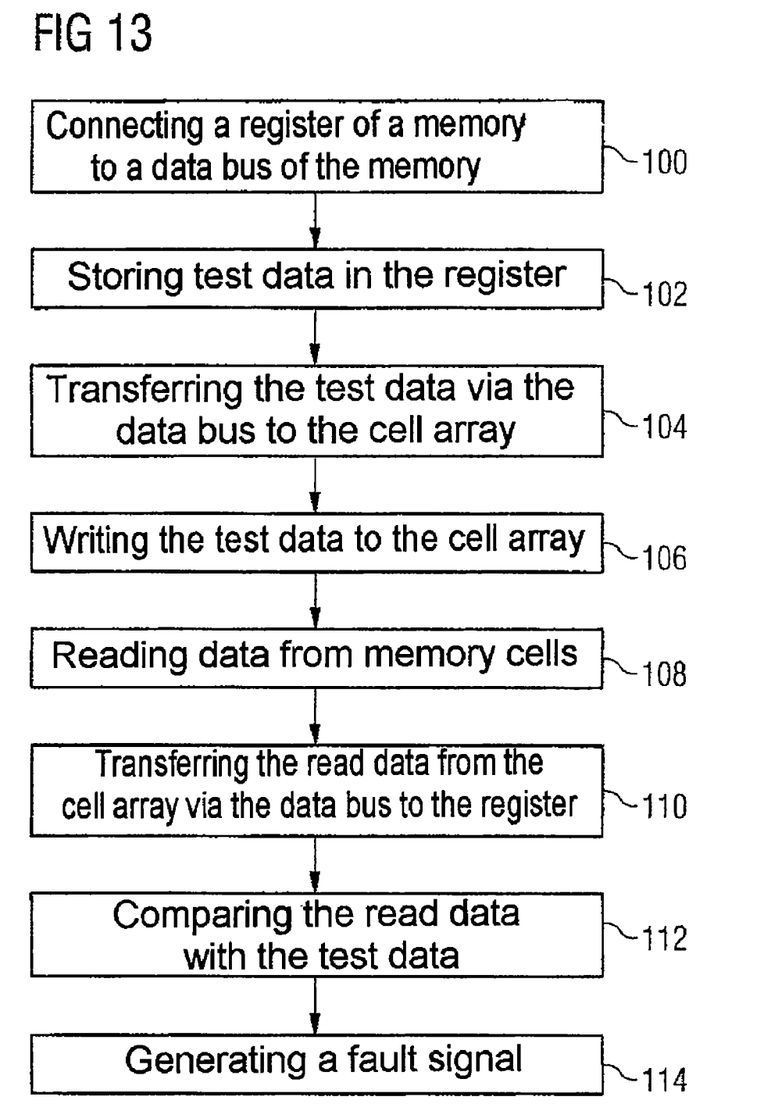
FIG. 13 shows a schematic flowchart of a further method for testing a memory chip.

FIG. 13 is a schematic flowchart of a test method as illustrated above with reference to FIGS. 10 and 11. In a first step 100, a register 72, 73, 74, 75 of a memory chip 12 to be tested may be coupled to a data bus 70, via which, in a normal operating mode of the memory chip 12, input amplifiers 68 of the memory chip 12 may be coupled to a cell array 62. In a second step 102, test data may be stored in the register 72, 73, 74, 75. In a third step 104, the test data may be transferred from the register 72, 73, 74, 75 to the cell array 62, 64, 66 via the data bus 70. In a fourth step 106, the transferred test data may be written to the cell array 62. In a fifth step 108, data may be read from the cell array 62. In a sixth step 110, the data read from the cell array 62 may be transferred from the cell array 62 to the register 72, 73, 74, 75 via the data bus 70. In a seventh step 112, the read data may be compared with the test data in order to determine whether the memory chip has faults. In an eighth step 114, a fault signal indicating whether the test data and the data read from the cell array match can be generated and transferred from the memory chip 12 to the test device 10 via one of the data outputs 20 of the memory chip 12.

The preceding description describes advantageous exemplary embodiments. The features disclosed therein and the claims and the drawings can, therefore, be useful for realizing various embodiments, both individually and in any combination. While the foregoing is directed to specific embodiments, other and further embodiments may be devised without departing from the basic scope, the scope being determined by the claims that follow.

What is claimed is:

1. A method for testing an integrated device comprising memory, the method comprising:
   providing a test device;
   at least one of:
      connecting N data inputs of the memory to a given data output of the test device, and
      connecting N data outputs of the memory to a given data input of the test device, wherein N is an integer $\geq 2$;
   transferring test data from the test device to the memory and writing the transferred test data to memory cells of the memory;
   reading data from memory cells of the memory and transferring the read data from the memory to the test device; and
   comparing the data read from the memory with the test data written to the memory to identify faults of the memory.

2. The method as claimed in claim 1, wherein $N=2^X$, and $1 \leq X \leq 6$.

3. The method as claimed in claim 1, in which at least two data outputs of the memory are coupled to a data input of the test device, wherein the step of comparing further comprises:
   determining whether a signal level at the data input of the test device falls below a first predetermined threshold level;
   determining whether the signal level at the data input of the test device exceeds a second predetermined threshold level;
   diagnosing that a logic 0 is present at all the data outputs of the memory which are coupled to the data input of the test device when the signal level at the data input of the test device falls below the first predetermined threshold level; and
   diagnosing that a logic 1 is present at all the data outputs of the memory which are coupled to the selected data input of the test device when the signal level at the data input of the test device exceeds the second predetermined threshold level.

4. The method as claimed in claim 3, further comprising:
   selecting a data output of the memory; and
   turning off data outputs or output amplifiers of the memory which are not coupled to the selected data output of the memory.

5. A test device for testing a memory, the test device comprising:
- a plurality of data outputs, wherein an output amplifier is associated with each of the plurality of data outputs,
- a plurality of data inputs, wherein an input amplifier is associated with each of the plurality of data inputs, wherein at least one of:
    - each data input of the test device is coupled to a plurality of input terminals, wherein each of the plurality of input terminals is configured to be coupled to a respective data output of an integrated device comprising memory, and
    - each data output of the test device is coupled to a plurality of output terminals, wherein each of the plurality of output terminals is configured to be coupled to a respective data input of the integrated device comprising memory.

* * * * *